United States Patent
Kummel et al.

(10) Patent No.: US 10,373,824 B2
(45) Date of Patent: Aug. 6, 2019

(54) CVD SILICON MONOLAYER FORMATION METHOD AND GATE OXIDE ALD FORMATION ON SEMICONDUCTOR MATERIALS

(71) Applicant: Applied Materials, Inc., Santa Clara, CA (US)

(72) Inventors: Andrew C. Kummel, San Diego, CA (US); Mary Edmonds, San Diego, CA (US); Mei Chang, Saratoga, CA (US); Jessica S. Kachian, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/727,351

(22) Filed: Oct. 6, 2017

(65) Prior Publication Data

US 2018/0033610 A1 Feb. 1, 2018

Related U.S. Application Data

(63) Continuation of application No. 14/686,870, filed on Apr. 15, 2015, now Pat. No. 9,824,889.

(Continued)

(51) Int. Cl.
*C23C 16/24* (2006.01)
*H01L 21/02* (2006.01)

(52) U.S. Cl.
CPC .... *H01L 21/0262* (2013.01); *H01L 21/02387* (2013.01); *H01L 21/02532* (2013.01); *H01L 21/02658* (2013.01)

(58) Field of Classification Search
CPC .............. C23C 16/24; C23C 16/45525; H01L 21/0262; H01L 21/02387; H01L 21/02532; H01L 21/02658
See application file for complete search history.

(56) References Cited

U.S. PATENT DOCUMENTS 9,305,780 B2 4/2016 Edmonds et al.
9,824,889 B2 * 11/2017 Kummel ........... H01L 21/02387
(Continued)

FOREIGN PATENT DOCUMENTS

JP 2002-306926 A 10/2002

OTHER PUBLICATIONS

Akazawa, M., et al., "High-k Al2O3 MOS Structures with Si Interface Control Layer Formed on Air-exposed GaAs and InGaAs Wafers," Appl. Surf. Sci., 256, 5708, (2010).
(Continued)

*Primary Examiner* — Bret P Chen
(74) *Attorney, Agent, or Firm* — Patterson + Sheridan LLP (57) ABSTRACT

Methods for depositing silicon include cycling dosing between 1 and 100 cycles of one or more first chlorosilane precursors on a III-V surface at a temperature between 300° C. and 500° C. to form a first layer. Methods may include desorbing chlorine from the first layer by treating the first layer with atomic hydrogen to form a second layer. Methods may include forming a silicon multilayer on the second layer by cycling dosing between 1 and 100 cycles of one or more second chlorosilane precursors and atomic hydrogen at a temperature between 300° C. and 500° C. A layered composition includes a first layer selected from the group consisting of $In_xGa_{1-x}As$, $In_xGa_{1-x}Sb$, $In_xGa_{1-x}N$, SiGe, and Ge, wherein X is between 0.1 and 0.99, and a second layer, wherein the second layer comprises Si—H and Si—OH.

20 Claims, 4 Drawing Sheets

Related U.S. Application Data (60) Provisional application No. 61/981,979, filed on Apr. 21, 2014.

(56) References Cited

U.S. PATENT DOCUMENTS

| | | | |
|---|---|---|---|
| 2004/0113190 A1 | 6/2004 | Oh et al. | |
| 2007/0269604 A1 | 11/2007 | Francis et al. | |
| 2010/0279479 A1 | 11/2010 | Hatem et al. | |
| 2011/0241084 A1* | 10/2011 | Wu | H01L 29/165 257/288 |
| 2011/0262642 A1 | 10/2011 | Xiao et al. | |
| 2012/0220137 A1 | 8/2012 | Ota et al. | |
| 2013/0280918 A1 | 10/2013 | Ahmed | |

OTHER PUBLICATIONS

Azakawa, M., et al., "Control of GaAs and InGaAs Insulator-Semiconductor and Metal-Semiconductor Interfaces by Ultrathin Molecular Beam Epitaxy Si Layers," Jpn. J. Appl. Phys., 30, 3744, (1991).

Davis, Robert F., et al., "Atomic Layer Epitaxy of Silicon, Silicon/Germanium and Silicon Carbide via Extraction/Exchange Processes," Office of Naval Research Technical Report, Jan. 1991, pp. 1-33.

El Kazzi, M., et al., "Sub-nm Equivalent Oxide Thickness on Si-passivated GaAs Capacitors with Low Dit ," Appl. Pilys. Lett., 99, 052102, (2011).

Gupta, P., et al., "Hydrogen Desorption Kinetics from Monohydride and Dihydride Species on Silicon Surfaces," Phys. Rev. B, 37, 8234 (1988).

Hasunuma, E., et al., "Gas-phase-reaction-controlled Atomic-layer-epitaxy of Silicon," J. Vac. Sci. Technol. A, 16(2), (1998).

Koleske, D.D., et al., Atomic Layer Epitaxy of Si on Ge(100) Using $Si_2Cl_6$ and Atomic Hydrogen, Appl. Phys. Lett., 64 (7), Feb. 1994, pp. 884-886.

Koleske, D.D., et al., "Atomic layer epitaxy of Si on Ge(100): Direct recoiling studies of film morphology," J. Appl. Phys. 76 (3) Aug. 1, 1994, pp. 1615-1621.

Lee, J., et al., "Kinetics of $H_2$ ($D_2$) Desorption from aGe (100)-2x1: H (D) Surface Studied Using Scanning Tunneling Microscopy and Temperature Programmed Desorption," J. Chern. Phys., 118, 1929, (2003).

McIntosh, F.G., et al., "Silicon monolayer growth using dichlorosilane and hydrogen in a near atmospheric pressure chemical vapor deposition reactor," Thin Solid Films, vol. 225, Issues 1-2, Mar. 25, 1993, pp. 183-186. Abstract only.

Shin, B., et al., "Pre-atomic Layer Deposition Surface Cleaning and Chemical Passivation of (1 00) $In_{0.2}Ga_{0.8}As$ and Deposition of Ultrathin $Al_2O_3$ Gate Insulators," Appl. Phys. Lett., 93, 05291 1 (2008).

Sugahara, Satoshi, et al., "Modeling of silicon atomic-layer-epitaxy," Applied Surface Science 107 (1996) 161-171.

Yokohama, S., et al., Limiting Atomic-Layer Deposition of Si on $SiO_2$ by Alternate Supply of $Si_2H_6$ and $SiCl_4$, Appl. Phys. Lett., 79 (5), (2001 ).

* cited by examiner

CVD SILICON MONOLAYER FORMATION METHOD AND GATE OXIDE ALD FORMATION ON SEMICONDUCTOR MATERIALS

CROSS-REFERENCE TO RELATED APPLICATIONS

This application is a continuation of U.S. patent application Ser. No. 14/686,870, filed on Apr. 15, 2015, now U.S. Pat. No. 9,824,889, issued on Nov. 21, 2017, which is herein incorporated by reference in its entirety, which claims benefit of U.S. Provisional Patent Application Ser. No. 61/981,979, filed Apr. 21, 2014, which is herein incorporated by reference in its entirety.

FIELD

Embodiments of the present disclosure generally relate to deposition of materials. Another field of the present disclosure is semi-conductor device fabrication technology. Particular applications of the present disclosure include the formation of silicon layers.

BACKGROUND

A sub 400° C. Atomic Layer Deposition (ALD) process has been reported for growing monolayers of Si on clean surfaces by alternating pulses of $Si_2H_6$ and $SiCl_4$ employed with the substrate temperature varied between 355°-385° C. The process is slow, with each ALD cycle taking several minutes and the desorption of the HCl(g) biproduct being slow below 400° C. Other processes include monolayer silicon ALD growth on Ge with use of alternating pulses of $Si_2Cl_6$ and atomic hydrogen, or $Si_2Cl_6$ and $Si_2H_6$, at undesirably high substrate temperatures of 400°-465° C. These processes, however, are not self-limiting.

Physical vapor deposition (PVD) of silicon for passivation of III-V surfaces has been reported, but requires a silicon multilayer as the silicon is not ordered. Also, the PVD deposition of silicon is not compatible with processing of three dimensional devices such as finFETs on large semiconductor wafers.

There is a need in the art to provide self-limiting and saturating silicon Chemical Vapor Deposition (CVD) and ALD on non-silicon surfaces.

SUMMARY

In one embodiment, a method for depositing silicon, the method includes cycling dosing between 1 and 100 cycles of one or more first chlorosilane precursors on a III-V surface at a temperature between 300° C. and 500° C. to form a first layer. The method may include desorbing chlorine from the first layer by treating the first layer with atomic hydrogen to form a second layer. The method may include forming a silicon multilayer on the second layer by cycling dosing between 1 and 100 cycles of one or more second chlorosilane precursors and atomic hydrogen at a temperature between 300° C. and 500° C.

In another embodiment, a method for depositing silicon includes cycling dosing between 1 and 100 cycles of one or more chlorosilane precursors on a III-V surface at a temperature between 300° C. and 500° C. to form a first layer.

In another embodiment, a layered composition includes a first layer selected from the group consisting of $In_xGa_{1-x}As$, $In_xGa_{1-x}Sb$, $In_xGa_{1-x}N$, SiGe, and Ge, wherein X is between 0.1 and 0.99, and a second layer, wherein the second layer comprises Si—H and Si—OH.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, a method for depositing silicon includes cycling dosing between 1 and 100 cycles of one or more first chlorosilane precursors on a III-V surface at a temperature between 300° C. and 500° C. to form a first layer. The method may include desorbing chlorine from the first layer by treating the first layer with atomic hydrogen to form a second layer. The method may include forming a silicon multilayer on the second layer by cycling dosing between 1 and 100 cycles of one or more second chlorosilane precursors and atomic hydrogen at a temperature between 300° C. and 500° C.

In another embodiment, a method for depositing silicon includes cycling dosing between 1 and 100 cycles of one or more chlorosilane precursors on a III-V surface at a temperature between 300° C. and 500° C. to form a first layer.

In another embodiment, a layered composition includes a first layer selected from the group consisting of $In_xGa_{1-x}As$, $In_xGa_{1-x}Sb$, $In_xGa_{1-x}N$, SiGe, and Ge, wherein X is between 0.1 and 0.99, and a second layer, wherein the second layer comprises —Si—H and —Si—OH.

Embodiments of the present disclosure may provide self-limiting and saturating atomic layer deposition (ALD) and self-limiting and saturating chemical vapor deposition (CVD) of a silicon seed layer on a variety of non-silicon layer surfaces. Embodiments of the present disclosure may include depositing a silicon seed layer on substrates of varying alloy compositions (e.g. indium gallium arsenide, indium gallium antimonide, indium gallium nitride, and silicon-germanium), as well as germanium and metallic substrates.

Embodiments of the present disclosure provide silicon ALD and can use different substrates. Embodiments provide self-limiting and saturating ALD growth. Methods of the invention produce atomically ordered silicon, with both monolayer and multilayer deposition occurring in a commensurate structure to the underlying substrate surface.

Artisans have failed, to the knowledge of the present inventors, to provide self-limiting and saturating silicon CVD on non-silicon surfaces despite studies and reports in the literature of temperature ranges at which chloride etch product (group III-Cl$_3$) desorption occurs from similar applicable substrates of InP, InSb, and GaAs. The fully chlorinated disilane precursor self-limiting CVD process produces saturation when all surface sites are terminated by Si—Cl groups. Thus, desorption of Cl$_2$(g), HCl(g), or other AClx (A=group III or group IV element) from substrate surface sites may occur until all surface sites become terminated by —Si—Cl. Chlorosilane precursors include, but are not limited to, SiCl$_4$, Si$_2$Cl$_6$, Si$_3$Cl$_6$. Continued silicon growth on top of the saturated self-limited CVD silicon seed layer may be done through an H/Cl exchange reaction where Cl is removed from the surface and replaced through hydrogen termination through atomic hydrogen dosing.

Experiments of the present disclosure may be performed with known hardware and will be understood by artisans in view of the general knowledge in the art and the description that follows to illustrate broader features of some embodiments of the present disclosure.

In one embodiment, a self-limiting and saturating chemical vapor deposition procedure is based upon the saturation of the substrate semiconductor or metallic surface sites through a surface termination with Si—Cl groups by dosing chlorosilane precursors at about 400° C. Chlorosilane precursors may include SiCl$_4$, Si$_2$Cl$_6$, and Si$_3$Cl$_8$ and mixtures thereof.

Once all surface sites are terminated with Si—Cl groups, the reaction becomes self-terminating, as chlorine bonds to silicon more strongly than all other semiconductor or metallic materials. Further silicon growth can occur on the self-limiting chemical vapor deposition saturated surface by keeping the substrate temperature between about 300° C. to about 500° C., about 400° C., and dosing atomic hydrogen to remove chlorine and replace the surface termination with hydrogen. The Si—H terminated surface can then undergo silicon ALD for continuous silicon multilayer growth by dosing Si$_2$Cl$_6$ and atomic hydrogen at about 400° C.

Dosing parameters for saturation coverage of silicon surface by Si$_2$Cl$_6$ dosing on clean InGaAs surface may be shown by, for example, X-Ray Photoelectron Spectroscopy (XPS). During this stage, Scanning Tunneling Microscopy (STM) and XPS measurements may be performed to investigate surface bonding configurations and electronic structures of Si/InGaAs(001)-(2×4). Thermal annealing measurements may also be performed during this time to demonstrate thermal stability of the surface.

During MegaLangmuir high pressure pulsing of Si$_2$Cl$_6$ at about 400° C. with low dose atomic hydrogen, STM and XPS measurements may be performed to determine surface contamination following high pressure dosing of Si$_2$Cl$_6$, as well as multilayer silicon deposition on top of the saturating silicon monolayer surface through silicon ALD with MegaLangmuir high pressure dosing of Si$_2$Cl$_6$ at 400° C. followed by low pressure low dose reaction of atomic hydrogen at 400° C. via thermal gas cracker with a heated iridium tube to eliminate oxygen contamination or surface damage from other atomic hydrogen sources. Thermal annealing measurements may also be performed during this time to determine thermal stability of the surface.

Figure 1:
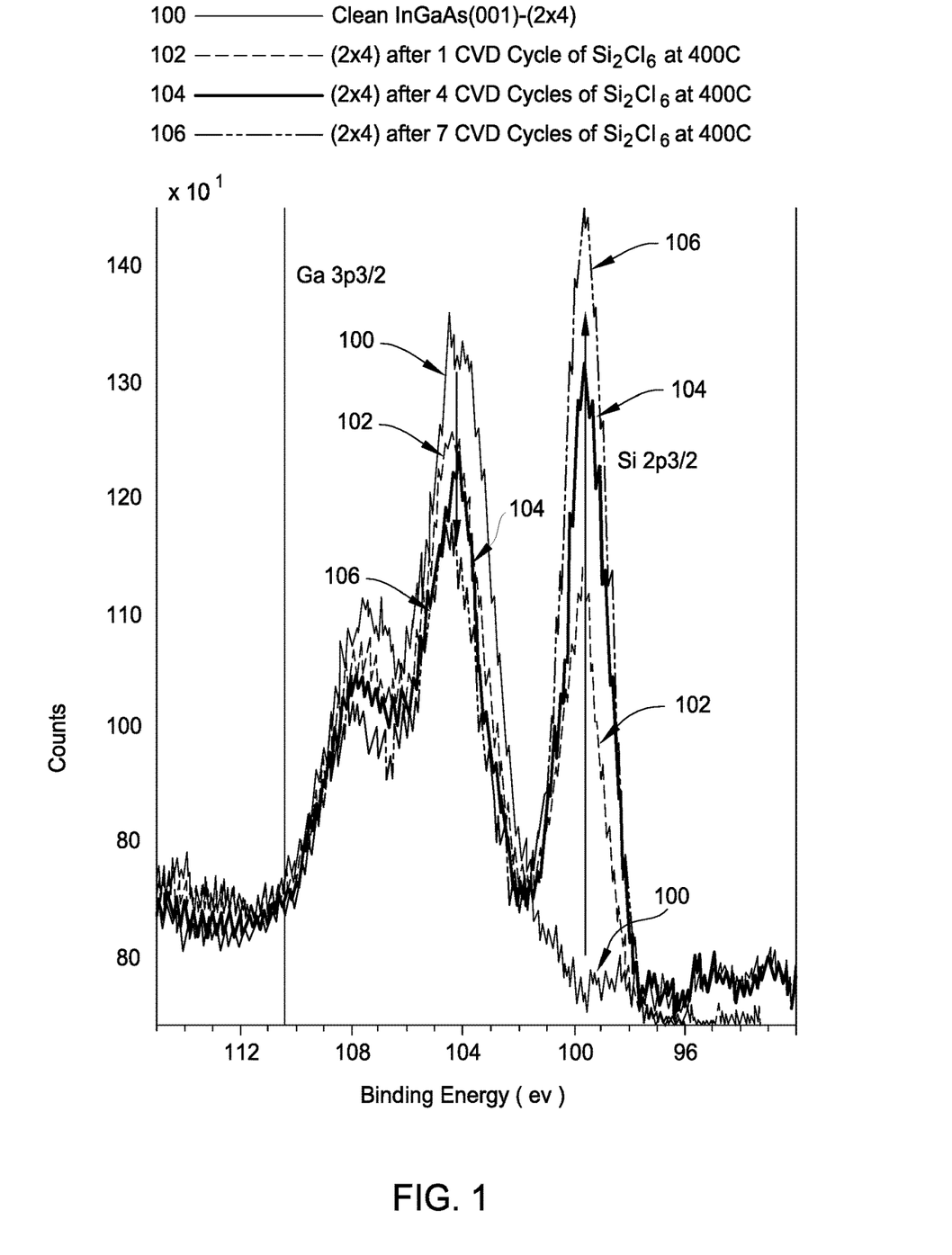
FIG. 1 is overlaid XPS spectra illustrating the increase of the silicon 2p3/2 peak and the decrease in the gallium 3p3/2 peak according to some embodiments.

A preferred embodiment of a self-limiting and saturating CVD procedure may include forming a clean In$_{0.53}$Ga$_{0.47}$As (001)-(2×4) surface (via decapping or atomic hydrogen in situ cleaning), dosing with at least 3 MegaLangmuir of Si$_2$Cl$_6$ at a sample temperature of about 400° C. For the purpose of this description, 3 MegaLangmuir of Si$_2$Cl$_6$ is denoted as a cycle; however, more than one cycle may be needed to reach saturation. To complete the self-limiting and saturating silicon seed layer, an additional 3 cycles, and an additional 6 cycles of 3 MegaLangmuir of Si$_2$Cl$_6$ at 400° C. may be dosed and an XPS spectrum may be taken of the surface following, for example, 1, 4, and 7 CVD cycle doses with a nonmonochromatic aluminum channel X-ray flood source system at a glancing angle of 30° to verify surface saturation of silicon with the occurrence of chlorine termination. FIG. 1 is overlaid XPS spectra illustrating the increase of the silicon 2p3/2 peak and the decrease in the gallium 3p3/2 peak according to some embodiments of the present disclosure.

As shown in FIG. 1: Non-monochromatic aluminum channel X-ray flood source system spectra for clean decapped In$_{0.53}$Ga$_{0.47}$As(001)-(2×4) surface (100), In$_{0.53}$Ga$_{0.47}$As(001)-(2×4) surface following 1 CVD cycle at 400° C. (102), In$_{0.53}$Ga$_{0.47}$As(001)-(2×4) surface following 4 CVD cycles at 400° C. (104), and In$_{0.53}$Ga$_{0.47}$As(001)-(2×4) surface following 7 CVD cycles at 400° C. (106). The spectra are shown of the Ga3p3/2 and Si 2p3/2 peaks. As shown in FIG. 1 (by, for example, the Ga 3p3/2 peak at 105 eV of 100, 102, 104 and 106), in comparing the substrate gallium 3p3/2 peak for the 4 and 7 cycle surfaces (104 and 106, respectively), there is no further decrease in this gallium 3p3/2 substrate peak, indicative of self-limiting and saturating surface coverage of silicon with chlorine termination. There is a small increase in the silicon 2p3/2 peak at 99 eV when comparing the 4 and 7 cycle surfaces (104 and 106, respectively), and this can be explained by the poor alignment achieved with a non-monochromatic XPS system, as the X-ray source floods the sample, sample holder, and manipulator with X-rays and thus excess silicon signal will also be coming from sources other than the sample. The indium, gallium, and arsenic substrate peaks are only present on the sample, thus a decrease in these peaks will indicate increased surface coverage.

Figure 2:
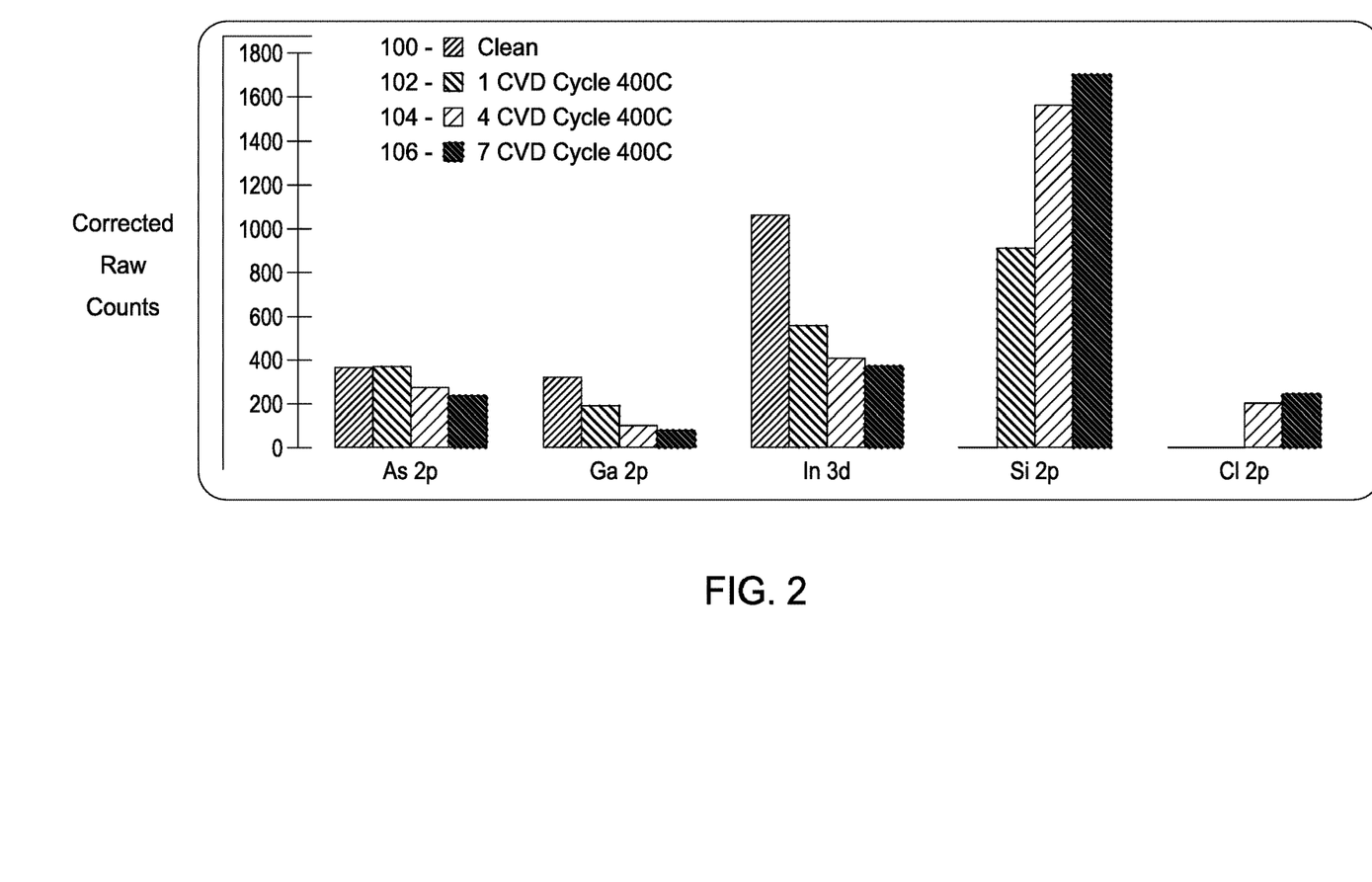
FIG. 2 illustrates the raw counts corrected by Schofield photoionization cross sectional relative sensitivity factors recorded for doublet peak pairs of As 2p, Ga 2p, In 3d, Si 2p, and Cl 2p according to some embodiments.

FIG. 2 illustrates the raw counts corrected by Schofield photoionization cross sectional relative sensitivity factors recorded for doublet peak pairs of As 2p, Ga 2p, In 3d, Si 2p, and Cl 2p for the clean decapped In$_{0.53}$Ga$_{0.47}$As(001)-(2×4) surface (100) as well as the 1, 4, and 7 CVD cycle dosed surfaces at sample temperature 400° C. (102, 104 and 106, respectively). As shown in FIG. 2, the 1 cycle CVD dosed surface at 400° C. (102) shows no presence of chlorine, indicating this surface is below monolayer silicon saturation coverage, as Cl, species are still desorbing from unreacted In, Ga, or As substrate sites. The As 2p, Ga 2p, In 3d substrate peaks undergo little to no decrease in comparing the 4 and 7 CVD cycle surfaces (104 and 106, respectively), consistent with saturation of silicon on the In$_{0.53}$Ga$_{0.47}$As (001)-(2×4) surface being reached after 7 self-limiting and saturating CVD cycles at 400° C. (106). Cl$_2$ and SiCl$_x$ desorption is close to zero at 400° C. on silicon.

As shown in FIG. 2: Non-monochromatic aluminum channel X-ray flood source system raw counts corrected by Schofield photoionization cross sectional relative sensitivity factors for clean decapped In$_{0.53}$Ga$_{0.47}$As(001)-(2×4) surface (100), In$_{0.53}$Ga$_{0.47}$As(001)-(2×4) surface following 1 CVD cycles at 400° C. (102), In$_{0.53}$Ga$_{0.47}$As(001)-(2×4) surface following 4 CVD cycles at 400° C. 104) and In$_{0.53}$Ga$_{0.47}$As(001)-(2×4) surface following 7 CVD cycles at 400° C. (106).

The filled-state STM image of In$_{0.53}$Ga$_{0.47}$As(001)-(2×4) surface may be obtained, for example, following 10 cycles of 100 Langmuir Si$_2$Cl$_6$ dosed at 400° C. followed by 80 Langmuir atomic hydrogen dosed at 400° C., and a 30 min anneal at 450° C. STM image may be compared to the STM image of the clean decapped In$_{0.53}$Ga$_{0.47}$As(001)-(2×4) surface (100). Cyclic dosing of $Si_2Cl_6$ and atomic hydrogen may be conducted in order to ensure STM imaging is of a Si—H terminated surface, as this surface may be prepared for further —OH functionalization via $H_2O$ or HOOH dosing or alternative multilayer Si growth via $Si_2Cl_6$ plus atomic hydrogen. The cyclic dosed surface contains high atomic surface order and the surface should be terminated by Si—H, leaving the surface Fermi level unpinned. STM imaging indicates that silicon absorbs in a commensurate structure with average row spacing being nearly identical to the $In_{0.53}Ga_{0.47}As(001)$-(2×4) surface at 1.5 nm, consistent with III-V dangling bond elimination.

Figure 3:
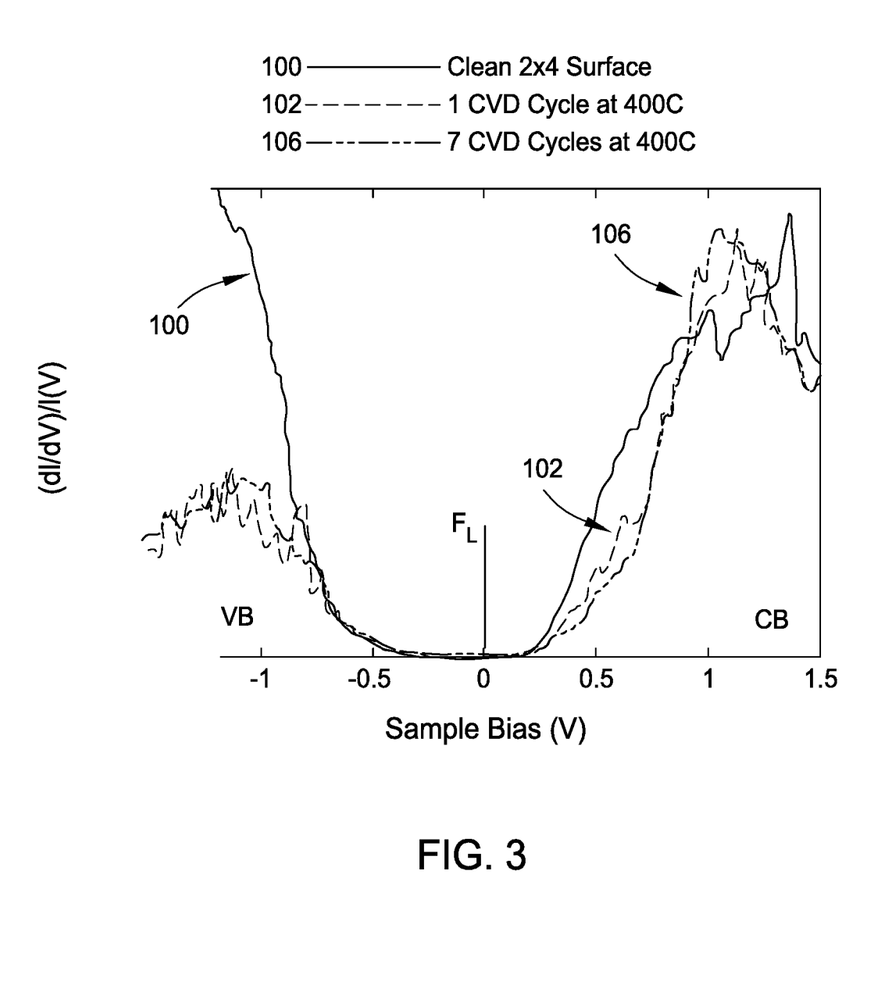
FIG. 3 illustrates the scanning tunneling spectroscopy (STS) results according to some embodiments.

The self-limiting and saturating CVD nucleation schemes should also translate well on other crystallographic faces such as $In_xGa_{1-x}As(110)$, $In_xGa_{1-x}Sb(110)$, $In_xGa_{1-x}N$ (110), as silicon binds strongly to these materials. The desorption product may be $GaCl_3$ and $InCl_3$; therefore, the processes described herein also remove excess Ga and In from the surface which should improve the electronic properties. FIG. 3 illustrates the scanning tunneling spectroscopy (STS) results for the clean decapped In0.53Ga0.47As(001)-(2×4) surface (100) as well as the 1 CVD cycle dosed surface (102) and 7 CVD cycle dosed surface (106), where each CVD cycle consists of 3 MegaLangmuir of $Si_2Cl_6$ dosed at 400° C. STS essentially probes the local density of states of the surface, and after 1 and 7 cycles (102 and 106, respectively), the surface Fermi level remains at the same location as the clean surface, slightly above midgap with conduction and valance band edges also lining up, indicating the silicon deposition process does not pin the Fermi level nor degrade the surface density of states by creating defect states in the band gap.

As shown in FIG. 3: STS of clean decapped $In_{0.53}Ga_{0.47}As(001)$-(2×4) surface (100), $In_{0.53}Ga_{0.47}As$ (001)-(2×4) surface following 1 CVD cycles at 400° C. (102), and $In_{0.53}Ga_{0.47}As(001)$-(2×4) surface following 7 CVD cycles at 400° C. (104). The curves shown are averaged over 6-8 curves to represent typical STS of the indicated surface. All shown results are taken with no further annealing. For continued ALD growth of silicon on top of initial CVD self-limiting seed layer, the substrate temperature may be kept at 400° C., and atomic hydrogen dosed to remove chlorine and replace the surface termination with hydrogen. The Si—H terminated surface can then undergo silicon ALD for continuous silicon multilayer growth by dosing $Si_2Cl_6$ and atomic hydrogen at 400° C. With use of atomic hydrogen, an additional desorption product is possible (HCl) which may be useful in forming a more ordered surface and extending the technology to, for example, SiGe. On SiGe, the $Si_2Cl_6$ MegaLangmuir dosing plus atomic hydrogen process should also be self-limiting since HCl should desorb from Ge sites at a lower temperature than from Si sites. However, it is also possible the process will be self-limiting using just $Si_2Cl_6$ because $GeCl_2$ desorbs at a lower temperature than $SiCl_2$.

Self-limiting and saturating chemical vapor deposition processes described herein may include large pressure pulses of $Si_2Cl_6$ (2.5×10−2 torr for 2 to 6 minutes) at 400° C. to deposit a saturated silicon monolayer with chlorine termination. After monolayer saturation, low pressure pulses of atomic hydrogen (1×10−6 torr for 100 to 500 seconds) may be dosed at 400° C. via a thermal gas cracking process using a heated iridium tube to crack molecular $H_2$ (g), into atomic hydrogen species. This gas cracking process with low doses provides sufficient cleanliness by avoiding contamination associated with heated tungsten filaments and plasma damage that can occur with hydrogen plasmas, which can also hinder surface cleanliness and order. Furthermore, dosing with MegaLangmuir high pressure pulses of $Si_2Cl_6$ helps to protect the surface from oxygen and carbon contamination. The surface remains terminated with chlorine or hydrogen throughout the CVD and subsequent ALD dosing processes to ensure silicon is protected from unwanted carbon and oxygen contamination.

Figure 4:
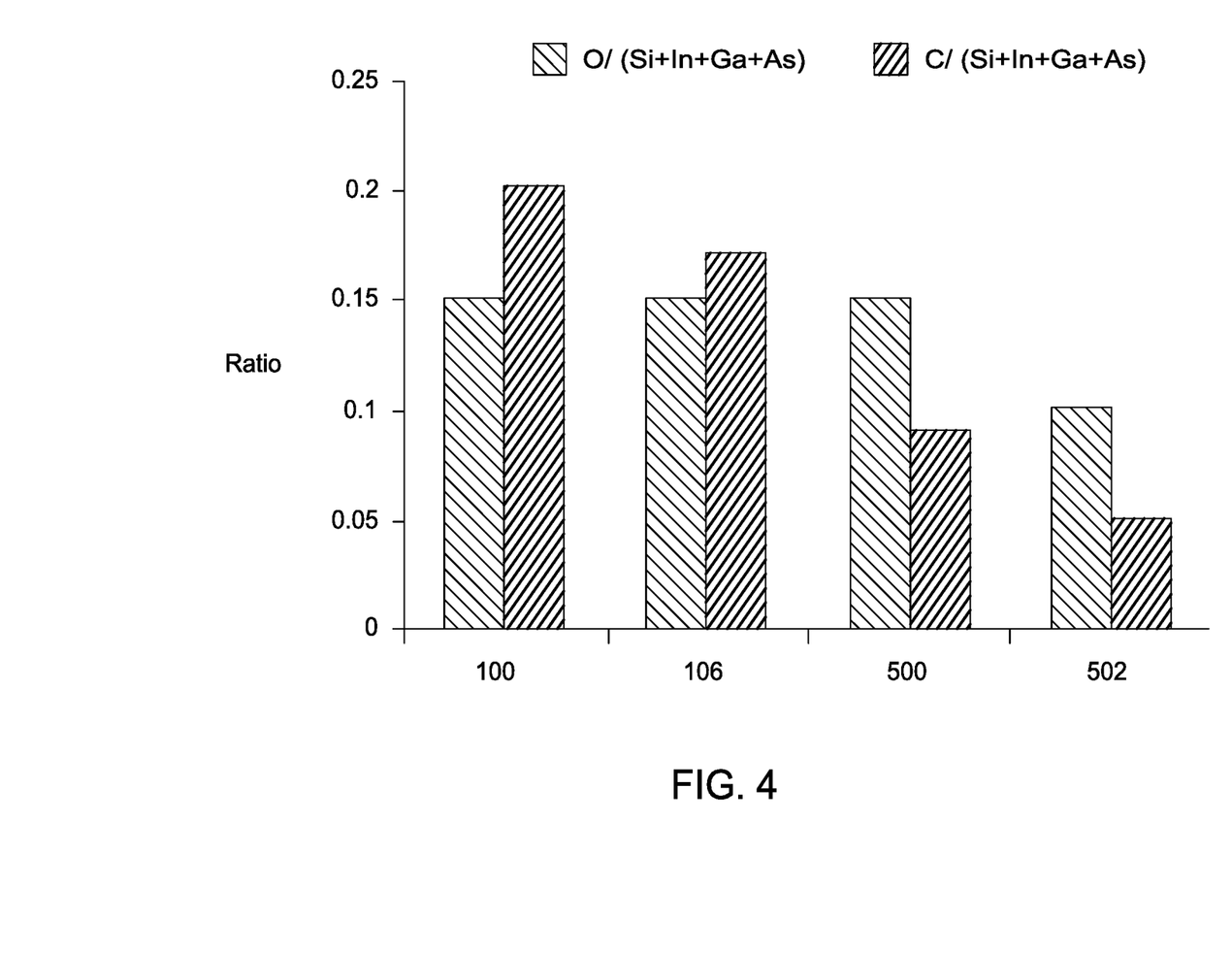
FIG. 4 illustrates XPS carbon and oxygen contamination results according to some embodiments.

FIG. 4 illustrates XPS carbon and oxygen contamination results on the clean decapped $In_{0.53}Ga_{0.47}As(001)$-(2×4) surface (100), the 7 CVD cycle dosed surface (106), the 7 CVD cycle dosed surface following 500 Langmuir atomic hydrogen at 400° C. (500), and the 7 CVD cycle dosed surface following 500 Langmuir atomic hydrogen at 400° C. and 4 additional silicon ALD cycles at 400° C. (502). Each CVD cycle consists of 3 MegaLangmuir of $Si_2Cl_6$ dosed at 400° C., and each additional silicon ALD cycle consists of 9 MegaLangmuir of $Si_2Cl_6$ dosed at 400° C. followed by 500 Langmuir atomic hydrogen dosed at 400° C. The subsequent silicon ALD process deposits additional silicon on top of the saturated and self-limiting silicon CVD monolayer, creating a silicon multilayer. The results show that, throughout the MegaLangmuir CVD and subsequent silicon ALD processes, the surface remains protected from both carbon and oxygen with both contaminants slightly decreasing following multilayer silicon deposition. These results are consistent with MegaLangmuir high pressure pulse dosing of $Si_2Cl_6$ providing chemical protection and cleaning of the surface.

As shown in FIG. 4: XPS tabulated oxygen and carbon results on the clean decapped $In_{0.53}Ga_{0.47}As(001)$-(2×4) surface (100), $In_{0.53}Ga_{0.47}As(001)$-(2×4) surface following 7 CVD cycles at 400° C. (106), $In_{0.53}Ga_{0.47}As(001)$-(2×4) surface following 7 CVD cycles at 400° C. and 500 Langmuir atomic hydrogen at 400° C. (500), and $In_{0.53}Ga_{0.47}As$ (001)-(2×4) surface following 7 CVD cycles at 400° C. and 500 Langmuir atomic hydrogen at 400° C. and 4 additional silicon ALD cycles at 400° C. (502). Both MegaLangmuir CVD and ALD processes at 400° C. leave the surface protected from carbon and oxygen contamination.

STM images (for example, 30 nm×100 nm Filled-state STM images) of decapped $In_{0.53}Ga_{0.47}As(001)$-(2×4) following 7 CVD cycles at 400° C. and 500 Langmuir atomic hydrogen at 400° C., and 4 additional silicon ALD cycles at 400° C., and a 30 min anneal at 450° C., indicate regions of high atomic order with average row spacing being nearly identical to the $In_{0.53}Ga_{0.47}As(001)$-(2×4) surface at 1.5 nm, consistent with silicon adsorption in a commensurate structure and III-V dangling bond elimination. An enlarged inset from the STM images highlights vertically ordered atomic rows on the surface with row spacing nearly identical to the clean decapped surface at 1.5 nm.

Deposited monolayers of the invention provide the basis for the fabrication of gate stacks in III-V devices. The silicon monolayer serves several purposes: (1) The dangling bonds of the substrate will be transferred to silicon, which are then passivated by hydrogen, leaving the surface electrically passivated; (2) The saturated CVD monolayer of silicon with Cl termination may then react with atomic H in order to remove chlorine from the surface and create an HCl(g) reaction biproduct and terminate silicon with hydrogen, which will serve to protect the semiconductor, SiGe, or metallic substrate from oxidation and carbon contamination; (3) the silicon monolayer with possible hydrogen termination (i.e. Si—H) may also be employed for deposition of gate oxide through functionalization by an oxidant such as HOOH(g), which creates an Si—OH layer which would react with a metal ALD precursor thereby eliminating the need for metal precursor nucleation (for example with trimethyl aluminum predosing), decreasing EOT and lowering border trap density and fixed charged associated with interfacial layers, or even direct bonding of oxide to non-silicon semiconductors. The same procedure can be used for other crystallographic faces such as $In_xGa_{1-x}As(110)$, $In_xGa_{1-x}Sb(110)$, $In_xGa_{1-x}N(110)$, wherein X is between 0.1 and 0.99. Some ALD precursors such as those containing O or OH groups may directly react with the Si—H termination; (4) The silicon monolayer or silicon monolayer with additional oxide ALD may be used for metal contact formation; and (5) The silicon multilayer may be used as an ultrathin channel for strained Si on SiGe underlayers.

Atomic hydrogen removes chlorine from a monolayer of an ALD cycle and leaves uniform, ordered silicon on surface. The ALD deposited silicon multilayer may be used as a semiconductor functionalization protection layer while providing protection in vacuum from oxidation and carburization, and a thin silicon channel layer or a thin silicon contact layer, which is useful during deposition and processing of gate stacks on FinFETs for MOSFETs. Methods described herein may involve surface termination by Si—Cl groups followed by passivation with atomic hydrogen, creating Si—H termination, and surface functionalization. By keeping the silicon chemically protected at all times, the layer can be transferred within a typical semiconductor fabrication process.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention.

Various features of the invention are set forth in the appended claims.

The invention claimed is:

1. A method for depositing silicon, the method comprising:
    forming a silicon seed layer on a substrate surface comprising a III-V material or SiGe, by a process comprising:
        forming a Si—Cl monolayer by reacting the substrate surface with only a first reactive precursor, comprising cycling dosing multiple cycles of the first reactive precursor at a temperature between 300° C. and 500° C., wherein the first reactive precursor consists of one or more active species selected from the group consisting of $SiCl_4$, $Si_2Cl_6$, $Si_3Cl_8$, and mixtures thereof; and
        after forming the Si—Cl monolayer, desorbing chlorine from the Si—Cl monolayer by treating the Si—Cl monolayer with atomic hydrogen to form the silicon seed layer; and
    forming a silicon multilayer on the silicon seed layer by cycling dosing between 1 and 100 cycles of one or more second reactive precursors and atomic hydrogen at a temperature between 300° C. and 500° C.

2. The method of claim 1, wherein the cycling dosing of one or more first reactive precursors is performed at a temperature of about 400° C.

3. The method of claim 1, wherein the silicon multilayer comprises one or more ordered silicon structures, and wherein the one or more ordered silicon structures are commensurate with one or more substrate surface structures.

4. The method of claim 1, wherein forming the silicon seed layer and forming the silicon multilayer provides atomically ordered silicon in a commensurate structure to the substrate surface.

5. The method of claim 1, wherein the substrate surface is SiGe.

6. The method of claim 1, wherein the one or more second reactive precursors is one of $SiCl_4$, $Si_2Cl_6$, $Si_3Cl_8$, or mixtures thereof.

7. The method of claim 1, further comprising treating the silicon multilayer with an oxidant to form a Si—OH layer.

8. A method for depositing silicon, the method comprising:
    depositing a silicon monolayer with chlorine termination on a substrate surface comprising a III-V material or silicon-germanium, comprising reacting the substrate surface with multiple cycles of only a first reactive precursor consisting of $SiCl_4$, $Si_2Cl_6$, $Si_3Cl_8$, or combinations thereof, at a temperature between 300° C. and 500° C.

9. The method of claim 8, further comprising depositing a silicon multilayer on the silicon monolayer by cycling dosing between 1 and 100 cycles of one or more second reactive precursors and atomic hydrogen at a temperature between 300° C. and 500° C.

10. The method of claim 9, wherein the silicon multilayer comprises one or more ordered silicon structures, and wherein the one or more ordered silicon structures are commensurate with one or more substrate surface structures.

11. The method of claim 8, wherein the substrate surface is silicon-germanium.

12. The method of claim 8, wherein the one or more second reactive precursors is one of $SiCl_4$, $Si_2Cl_6$, $Si_3Cl_8$, or mixtures thereof.

13. The method of claim 8, further comprising treating the silicon multilayer with an oxidant to form a Si—OH layer.

14. A method for depositing silicon, the method comprising:
    forming a silicon chloride mono-layer on a surface comprising a III-V material or silicon-germanium, comprising saturating the surface using multiple cycles of only a first chlorosilane precursor of $SiCl_4$, $Si_2Cl_6$, $Si_3Cl_8$, or a combination thereof, at a temperature between 300° C. and 500° C. to form a silicon chloride monolayer.

15. The method of claim 14, further comprising desorbing chlorine from the silicon chloride monolayer by treating the silicon chloride monolayer with atomic hydrogen to form a silicon seed layer.

16. The method of claim 15, further comprising forming a silicon multilayer on the silicon seed layer by cycling dosing between 1 and 100 cycles of one or more second chlorosilane precursors and atomic hydrogen at a temperature between 300° C. and 500° C.

17. The method of claim 16, wherein one or more ordered silicon structures of the silicon multilayer are commensurate with one or more surface structures.

18. The method of claim 16, further comprising treating the silicon multilayer with an oxidant to form a Si—OH layer.

19. The method of claim 14, wherein the multiple cycles of the first chlorosilane precursor are performed at a temperature about 400° C.

20. The method of claim 14, wherein the surface is silicon-germanium.

* * * * *

UNITED STATES PATENT AND TRADEMARK OFFICE
CERTIFICATE OF CORRECTION

PATENT NO. : 10,373,824 B2
APPLICATION NO. : 15/727351
DATED : August 6, 2019
INVENTOR(S) : Andrew C. Kummel et al.

Page 1 of 1

It is certified that error appears in the above-identified patent and that said Letters Patent is hereby corrected as shown below:

In the Drawings

On Sheet 1 of 4, in Figure 1, on Y-axis, Line 1, delete "80" and insert -- 90 --, therefor.

In the Specification

In Column 1, Line 32, delete "biproduct" and insert -- byproduct --, therefor.

In Column 3, Line 12, delete "H/Cl'" and insert -- H/Cl --, therefor.

In Column 3, Line 12, delete "Cl'" and insert -- Cl --, therefor.

In Column 4, Line 45, delete "Cl," and insert -- $Cl_x$ --, therefor.

In Column 4, Line 59, delete "104)" and insert -- (104) --, therefor.

In Column 6, Line 58, delete "Cl'" and insert -- Cl --, therefor.

In Column 6, Line 60, delete "biproduct" and insert -- byproduct --, therefor.

Signed and Sealed this
Twenty-fourth Day of September, 2019

Andrei Iancu
*Director of the United States Patent and Trademark Office*